US012635490B2

(12) United States Patent　　(10) Patent No.:　US 12,635,490 B2
Ko et al.　　(45) Date of Patent:　May 19, 2026

(54) DEEP TRENCH ISOLATION INCLUDING AIR GAP AND EMBOSSED PORTION AND METHOD OF MANUFACTURING SAME

(71) Applicant: DB HiTek Co., Ltd., Bucheon-si (KR)

(72) Inventors: Han Seok Ko, Seoul (KR); Dae Il Kim, Cheongju-si (KR); Ji Houn Jung, Seoul (KR); Ung Bi Son, Bucheon-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 477 days.

(21) Appl. No.: 18/319,058

(22) Filed: May 17, 2023

(65) Prior Publication Data

US 2024/0243007 A1　　Jul. 18, 2024

(30) Foreign Application Priority Data

Jan. 16, 2023　(KR) ........................ 10-2023-0005849

(51) Int. Cl.
　*H10W 10/20*　　(2026.01)
　*H10D 30/01*　　(2025.01)
　*H10D 30/65*　　(2025.01)
　*H10W 10/00*　　(2026.01)

(52) U.S. Cl.
　CPC ........ *H10W 10/20* (2026.01); *H10D 30/0281* (2025.01); *H10D 30/65* (2025.01); *H10W 10/021* (2026.01)

(58) Field of Classification Search
　CPC ..... H10D 62/115–116; H10D 84/0188; H10D 84/929–933; H10D 84/991–992; H10D 64/679; H10D 64/687; H10D 30/0281; H10D 30/65; H10D 30/0221; H10D 30/603; H10D 62/307; H10D 62/371; H10W 10/021; H10W 10/20; H10W 10/014; H10W 10/17; H10W 10/0145; H10P 50/242
See application file for complete search history.

(56) References Cited

U.S. PATENT DOCUMENTS

| 4,356,211 | A | * | 10/1982 | Riseman | ........... | H10W 10/0142 |
| | | | | | | 257/E21.547 |
| 5,449,630 | A | * | 9/1995 | Lur | ........................ | H10B 12/37 |
| | | | | | | 438/386 |
| 5,662,768 | A | * | 9/1997 | Rostoker | .............. | H10B 12/038 |
| | | | | | | 257/E21.219 |

(Continued)

FOREIGN PATENT DOCUMENTS

| KR | 10-2003-0000592 A | 1/2003 |
| KR | 10-2022-0160336 A | 12/2022 |

*Primary Examiner* — Maliheh Malek
(74) *Attorney, Agent, or Firm* — Bridgeway IP Law Group, PLLC; Jihun Kim

(57) ABSTRACT

Proposed are a semiconductor device and a method of manufacturing the same, in which a first device isolation region includes a Pre-DTI region and a DTI region, wherein the DTI region is configured to be physically distinguishable by having an extension part with a substantially flat outer surface and a connection part with an outer surface including a concave and convex embossed portion so that an air gap in the first device isolation region is prevented from being formed in an asymmetric shape and is prevented from being externally exposed in a subsequent process.

12 Claims, 15 Drawing Sheets

(56) References Cited

U.S. PATENT DOCUMENTS

| | | | | |
|---|---|---|---|---|
| 5,877,061 | A * | 3/1999 | Halle | H10D 1/711 |
| | | | | 438/665 |
| 5,877,063 | A * | 3/1999 | Gilchrist | H10D 1/711 |
| | | | | 148/DIG. 138 |
| 6,008,104 | A * | 12/1999 | Schrems | H10B 12/038 |
| | | | | 257/E21.651 |
| 6,020,609 | A * | 2/2000 | Wu | H10D 1/047 |
| | | | | 257/E21.651 |
| 6,025,225 | A * | 2/2000 | Forbes | H10D 1/711 |
| | | | | 257/E21.651 |
| 6,159,874 | A * | 12/2000 | Tews | H10D 1/712 |
| | | | | 257/E21.651 |
| 6,204,141 | B1 * | 3/2001 | Lou | H10B 12/0387 |
| | | | | 438/665 |
| 6,448,131 | B1 * | 9/2002 | Cabral, Jr. | H10B 12/0387 |
| | | | | 438/386 |
| 6,495,411 | B1 * | 12/2002 | Mei | H10B 12/0387 |
| | | | | 438/386 |
| 6,770,526 | B2 * | 8/2004 | Chudzik | H10D 1/047 |
| | | | | 438/254 |
| 6,777,303 | B2 * | 8/2004 | Schrems | H10B 12/038 |
| | | | | 257/E21.651 |
| 6,821,844 | B2 * | 11/2004 | Hsu | H10B 12/37 |
| | | | | 438/249 |
| 6,841,443 | B2 * | 1/2005 | Temmler | H10B 12/0387 |
| | | | | 438/386 |
| 7,026,210 | B2 * | 4/2006 | Lai | H10P 50/642 |
| | | | | 257/E21.549 |
| 7,049,647 | B2 * | 5/2006 | Karcher | H10B 12/373 |
| | | | | 438/242 |
| 7,772,672 | B2 * | 8/2010 | Bian | H10B 41/30 |
| | | | | 257/397 |
| 7,968,418 | B1 * | 6/2011 | Labonte | H10W 10/0145 |
| | | | | 438/424 |
| 8,357,989 | B2 * | 1/2013 | Onishi | H10D 62/115 |
| | | | | 257/397 |
| 9,263,320 | B2 * | 2/2016 | Murata | H10D 62/115 |
| 9,401,410 | B2 * | 7/2016 | Hu | H10D 64/20 |
| 9,922,865 | B2 * | 3/2018 | Lee | H10W 10/0143 |
| 10,090,287 | B1 * | 10/2018 | Adusumilli | H10D 1/047 |
| 10,109,626 | B2 * | 10/2018 | Shinohara | H10D 84/0151 |
| 10,115,720 | B2 * | 10/2018 | Kim | H10D 84/83 |
| 10,243,047 | B2 * | 3/2019 | Shank | H10D 62/371 |
| 10,325,867 | B2 * | 6/2019 | Cho | H10D 84/83 |
| 10,692,966 | B2 * | 6/2020 | Yen | H10D 1/047 |
| 11,018,060 | B2 * | 5/2021 | Kang | H10D 84/0151 |
| 11,552,175 | B2 * | 1/2023 | Otsubo | H10D 30/65 |
| 11,756,794 | B2 * | 9/2023 | Arshad | H10D 1/68 |
| | | | | 438/391 |
| 11,894,381 | B2 * | 2/2024 | Chen | H10D 86/201 |
| 12,457,777 | B2 * | 10/2025 | Kim | H10D 62/115 |
| 12,500,118 | B2 * | 12/2025 | Hwang | H10D 62/393 |
| 12,514,015 | B2 * | 12/2025 | Maehashi | H10F 39/807 |
| 2001/0055846 | A1 * | 12/2001 | Beckmann | H10B 12/0387 |
| | | | | 438/386 |
| 2002/0072171 | A1 * | 6/2002 | Forster | H10B 12/038 |
| | | | | 257/E21.651 |
| 2003/0052088 | A1 * | 3/2003 | Khan | H10B 12/0387 |
| | | | | 438/719 |
| 2003/0143802 | A1 * | 7/2003 | Chen | H10B 12/0387 |
| | | | | 438/386 |
| 2003/0170952 | A1 * | 9/2003 | Furukawa | H10D 1/665 |
| | | | | 438/386 |
| 2004/0188739 | A1 * | 9/2004 | Takenaka | H10B 12/37 |
| | | | | 257/E21.396 |
| 2005/0079681 | A1 * | 4/2005 | Lee | H10B 12/0387 |
| | | | | 257/E21.396 |
| 2005/0245042 | A1 * | 11/2005 | Haupt | H10W 10/0145 |
| | | | | 257/E21.549 |
| 2007/0045769 | A1 * | 3/2007 | Bian | H10B 41/30 |
| | | | | 257/510 |
| 2008/0122030 | A1 * | 5/2008 | Cheng | H10D 1/712 |
| | | | | 257/532 |
| 2008/0305604 | A1 * | 12/2008 | Lin | H10D 1/712 |
| | | | | 438/386 |
| 2010/0258904 | A1 * | 10/2010 | Li | H10D 1/711 |
| | | | | 257/532 |
| 2011/0062547 | A1 * | 3/2011 | Onishi | H10D 62/115 |
| | | | | 438/421 |
| 2011/0175205 | A1 * | 7/2011 | Morii | H10P 90/1906 |
| | | | | 438/421 |
| 2011/0272702 | A1 * | 11/2011 | Kwon | H10D 1/711 |
| | | | | 257/E27.092 |
| 2012/0126306 | A1 * | 5/2012 | Kawaguchi | H10B 41/35 |
| | | | | 257/326 |
| 2013/0075857 | A1 * | 3/2013 | Choi | H10D 62/115 |
| | | | | 257/E21.546 |
| 2014/0008705 | A1 * | 1/2014 | Choi | H10D 30/63 |
| | | | | 257/255 |
| 2014/0291767 | A1 * | 10/2014 | Lee | H10W 10/0143 |
| | | | | 438/422 |
| 2015/0270339 | A1 * | 9/2015 | Inagaki | H10W 10/021 |
| | | | | 438/422 |
| 2016/0372429 | A1 * | 12/2016 | Cho | H10D 84/83 |
| 2017/0301668 | A1 * | 10/2017 | Kim | H10D 84/83 |
| 2017/0301669 | A1 * | 10/2017 | Shinohara | H10D 84/0151 |
| 2018/0082997 | A1 * | 3/2018 | Li | H10D 30/668 |
| 2018/0130869 | A1 * | 5/2018 | Hu | H10D 1/68 |
| 2018/0151410 | A1 * | 5/2018 | Usami | H10W 20/021 |
| 2018/0166322 | A1 * | 6/2018 | Lee | H10W 10/0143 |
| 2019/0229181 | A1 * | 7/2019 | Jia | H10D 1/692 |
| 2019/0287972 | A1 * | 9/2019 | Hafez | H10D 84/0158 |
| 2020/0343145 | A1 * | 10/2020 | Kang | H10D 84/0151 |
| 2020/0403072 | A1 * | 12/2020 | Otsubo | H10D 30/65 |
| 2022/0270932 | A1 * | 8/2022 | Kang | H10D 84/0151 |
| 2023/0115792 | A1 * | 4/2023 | Maehashi | H10F 39/807 |
| | | | | 257/292 |
| 2023/0187267 | A1 * | 6/2023 | Hwang | H10W 10/021 |
| | | | | 257/522 |
| 2023/0187268 | A1 * | 6/2023 | Park | H10W 10/021 |
| | | | | 257/343 |
| 2023/0187534 | A1 * | 6/2023 | Park | H10D 30/603 |
| | | | | 257/401 |
| 2023/0197754 | A1 * | 6/2023 | Jeon | H10F 39/811 |
| | | | | 257/292 |
| 2024/0105504 | A1 * | 3/2024 | Lin | H10P 90/1906 |
| 2024/0243007 | A1 * | 7/2024 | Ko | H10W 10/021 |
| 2024/0258371 | A1 * | 8/2024 | Otsubo | H10D 62/115 |
| 2024/0395599 | A1 * | 11/2024 | Sun | H10W 10/021 |
| 2025/0046649 | A1 * | 2/2025 | Hwang | H10W 10/021 |
| 2025/0149376 | A1 * | 5/2025 | Lee | H10W 10/0145 |
| 2025/0280607 | A1 * | 9/2025 | Ko | H10D 89/10 |
| 2025/0280617 | A1 * | 9/2025 | Cheng | H10F 39/8063 |
| 2025/0364310 | A1 * | 11/2025 | Lee | H10W 10/014 |
| 2025/0374575 | A1 * | 12/2025 | Chen | H10D 30/014 |
| 2026/0013207 | A1 * | 1/2026 | Lin | H10D 84/038 |

* cited by examiner

DEEP TRENCH ISOLATION INCLUDING AIR GAP AND EMBOSSED PORTION AND METHOD OF MANUFACTURING SAME

CROSS REFERENCE TO RELATED APPLICATION

The present application claims priority to Korean Patent Application No. 10-2023-0005849, filed Jan. 16, 2023, the entire contents of which is incorporated herein for all purposes by this reference.

BACKGROUND OF THE INVENTION

Field of the Invention

The present disclosure relates to a semiconductor device and its manufacturing method, particularly to a semiconductor device and a method of manufacturing the same, in which a first device isolation region includes a Pre-DTI region and a DTI region. The DTI region is configured to be physically distinguishable by having an extension part with a substantially flat outer surface and a connection part with an outer surface including a concave and convex embossed portion. This configuration aims to prevent the formation of an asymmetric air gap in the first isolation region and its exposure during subsequent processes.

Description of the Related Art

BCDMOS (Bipolar-CMOS-DMOS) technology requires a high breakdown voltage of 100 V or more. In order to meet such a high voltage requirement, a deep trench isolation (DTI) region forming process is used to prevent an increase in current leakage through electrical isolation between adjacent devices.

FIG. 1 is a reference sectional view illustrating that a DTI region 910 is formed in a conventional semiconductor device.

Referring to FIG. 1, the formation of the DTI region 910 used for electrical isolation between adjacent devices is depicted. First, a trench region is formed by etching a surface of a substrate 901 to a predetermined depth one time. Thereafter, the DTI region is formed by gap-filling an insulating material in the corresponding trench region. As described above, when forming the DTI region by forming the trench through a one-time process, there is a technical limit in the formation depth of the trench. Forming the DTI region by etching the substrate 901 in a single step can result in a DTI region that is not deep enough to provide sufficient electrical isolation between adjacent devices. Furthermore, there may be issues with gap-filling the formed trench after it has been formed. Due to such limitations, in particular, when the substrate 901 is formed to be relatively deep in order to realize a high breakdown voltage (BV) of 100 V or more, the DTI region cannot be formed deep. This leads to an increase in electric field below the DTI region and an increase in current leakage, resulting in a decrease in breakdown voltage (BV) characteristics. Thus, the distance between adjacent devices is increased to prevent noise generation therebetween, thereby inevitably increasing the overall chip size.

To address the issues mentioned above, the inventors of this disclosure have proposed an innovative semiconductor device with an improved structure, along with a method of manufacturing it. Further details will be provided later.

The foregoing is provided only to facilitate the comprehension of the background of this disclosure and should not be taken to imply that this disclosure is within the scope of the prior art known to those skilled in the field.

DOCUMENTS OF RELATED ART (Patent document 1) Korean Patent Application Publication No. 10-2003-0000592 "Method for manufacturing of semiconductor device with STI/DTI structure"

SUMMARY OF THE INVENTION

The present disclosure addresses the aforementioned problems in the related art by providing a semiconductor device and a method of manufacturing the same with the following objectives:

Firstly, to improve isolation characteristics between adjacent devices and reduce chip size, a first device isolation region is formed by dividing into two parts, namely a Pre-DTI region and a DTI region. This allows the first device isolation region to be easily formed to extend deep into a substrate.

Secondly, to prevent an air gap in the first device isolation region from being formed in an asymmetric shape and being externally exposed and damaged in a subsequent process, the DTI region is formed by performing multiple etching processes.

Thirdly, to further prevent the formation of an asymmetric air gap, at least a top outer surface of the DTI region is formed to be substantially flat.

Fourthly, to simplify the manufacturing process, a third trench is formed using the same photoresist layer used for the formation of a second trench, enabling the formation of an extension part in the substrate without requiring an additional patterning process.

Finally, to facilitate a subsequent process, a step formed at the boundary between an interlayer insulating layer and a first device isolation region is removed by removing an etch stop layer, depositing an additional insulating layer on the interlayer insulating layer, and then performing a CMP process.

In order to achieve the above objectives, according to one aspect of the present disclosure, there is provided a semiconductor device including: a substrate; a gate electrode disposed on the substrate; a source region defined in a surface of the substrate; a drain region defined in the surface of the substrate and spaced apart from the source region; a first device isolation region extending from the surface of the substrate to a predetermined depth and including an insulating material; and an air gap in the first device isolation region. Here, the first device isolation region may include: a Pre-DTI region defined in a top portion thereof; and a DTI region having a top portion connected to a bottom portion of the Pre-DTI region and a bottom portion located at a predetermined depth in the substrate, in which an outer surface of the DTI region may include a substantially flat side and an embossed portion.

According to another aspect of the present disclosure, the DTI region may be configured such that a top outer surface thereof connected to the pre-DTI region is substantially flat to a predetermined depth.

According to another aspect of the present disclosure, the air gap may have a bottom portion adjacent to the bottom portion of the DTI region and a top portion adjacent to the top portion of the DTI region.

According to another aspect of the present disclosure, the DTI region may include: a connection part connecting the Pre-DTI region and an extension part to each other and defining the top portion of the DTI region; and the extension part connected to a bottom portion of the connection part and extending downward to a predetermined depth.

According to another aspect of the present disclosure, the connection part may be formed by a gap-filling process of filling an insulating material in a trench by a first etching process, and the extension part may be formed by a gap-filling process of filling an insulating material in a trench by a second etching process.

According to another aspect of the present disclosure, the connection part may have an outer surface that is substantially flat in a vertical direction, and the extension part may have an outer surface including a concave portion and a convex portion that are alternately arranged in the vertical direction.

According to another aspect of the present disclosure, the outer surface of the extension part may have a laterally asymmetric side at a predetermined height.

According to another aspect of the present disclosure, the connection part may have a central axis that is substantially vertical.

According to another aspect of the present disclosure, the semiconductor device may further include an interlayer insulating layer disposed on the substrate and covering the gate electrode. Here, the Pre-DTI region may have a structure passing through the interlayer insulating layer.

According to another aspect of the present disclosure, there is provided a semiconductor device including: a substrate; a gate electrode disposed on the substrate; a source region defined in a surface of the substrate; a drain region defined in the surface of the substrate and spaced apart from the source region; a first device isolation region extending from the surface of the substrate to a predetermined depth; an air gap in the first device isolation region; and a second device isolation region extending from the surface of the substrate to a predetermined depth and located adjacent to at least one side of the first device isolation region, the second device isolation region being an STI region. Here, the first device isolation region may include: a Pre-DTI region defined in a top portion thereof; and a DTI region having a top portion connected to a bottom portion of the Pre-DTI region and a bottom portion located at a predetermined depth in the substrate, in which the DTI region may include: a connection part having an outer surface substantially flat in a vertical direction; and an extension part having an outer surface including a concave portion and a convex portion that are alternately arranged in the vertical direction.

According to another aspect of the present disclosure, the Pre-DTI region may have a narrower width than the second device isolation region.

According to another aspect of the present disclosure, the semiconductor device may further include: a body region defined in the substrate and surrounding the source region; a well region defined in the substrate and surrounding a first well region; and the first well region defined in the well region and surrounding the drain region.

According to another aspect of the present disclosure, the semiconductor device may further include: a buried layer; and a high voltage well region defined in the substrate and connected to the buried layer and the well region.

According to another aspect of the present disclosure, the connection part may have a central axis that is substantially vertical, and the extension part may have a side that extends obliquely.

According to another aspect of the present disclosure, the DTI region may be formed by performing a plurality of different etching processes.

According to another aspect of the present disclosure, the connection part may be formed in the top portion of the DTI region connected to the bottom portion of the Pre-DTI region, and the extension part may be connected to a bottom portion of the connection part and extend downward to a predetermined depth.

According to another aspect of the present disclosure, there is provided a method of manufacturing a semiconductor device, the method including: forming a gate electrode on a substrate; forming an interlayer insulating layer on the substrate to cover the gate electrode; forming an etch stop layer on the interlayer insulating layer; forming a Pre-DTI region of a first device isolation region in a shape passing through the interlayer insulating layer; and forming a DTI region of the first device isolation region in the substrate and below the Pre-DTI region so as to have a smaller width than the Pre-DTI region. Here, the DTI region may be formed by performing a plurality of different etching processes.

According to another aspect of the present disclosure, the forming of the Pre-DTI region may include forming a first trench by etching the etch stop layer and the interlayer insulating layer, and the forming of the DTI region may include: forming a second trench connected to a bottom portion of the first trench by a first etching process; and forming a third trench connected to a bottom portion of the second trench by a second etching process.

According to another aspect of the present disclosure, the first etching process may be a non-Bosch process, and the second etching process may be a Bosch process.

According to another aspect of the present disclosure, the forming of the second trench may include: patterning a photoresist layer on the etch stop layer and along an inner wall of the first trench; and etching the substrate from the bottom portion of the first trench using the photoresist layer, and the forming of the third trench may include etching the substrate from the bottom portion of the second trench using the photoresist layer.

According to another aspect of the present disclosure, the forming of the Pre-DTI region and the DTI region may further include: depositing a first insulating layer on the etch stop layer and in the first trench, the second trench, and the third trench; etch-backing the first insulating layer; and gap-filling a second insulating layer in the first trench, the second trench, and the third trench an on the first insulating layer.

According to another aspect of the present disclosure, the method may further include: depositing a third insulating layer on the interlayer insulating layer and the Pre-DTI region; and planarizing top surfaces of the interlayer insulating layer and the pre-DTI region by at least partially removing the third insulating layer.

According to another aspect of the present disclosure, the DTI region may include: a connection part configured such that an outer surface of a top portion thereof connected to the Pre-DTI region is substantially flat; and an extension part connected to a bottom portion of the connection part and configured such that an outer surface thereof has a vertically asymmetric side.

According to another aspect of the present disclosure, an etching depth of the connection part may be equal to or less than 10000 A.

The present disclosure has the following effects by the above configuration.

According to the present disclosure, by forming the first device isolation region by dividing into two parts, namely the Pre-DTI region and the DTI region, the first device isolation region can be easily formed to extend deep into a substrate, thereby improving isolation characteristics between adjacent devices and reducing chip size.

In addition, by forming the DTI region by performing a plurality of different etching processes, the air gap in the first device isolation region can be prevented from being formed in an asymmetric shape and can be prevented from being externally exposed and damaged in a subsequent process.

More specifically, by forming at least the top outer surface of the DTI region to be substantially flat, the air gap in the first device isolation region can be prevented from being formed in an asymmetric shape and can be prevented from being externally exposed and damaged in a subsequent process.

In addition, by forming the third trench by using the photoresist layer used for formation of the second trench, the extension part can be formed in the substrate without requiring an additional patterning process.

In addition, by removing the step formed at the boundary between the interlayer insulating layer and the first device isolation region by removing the etch stop layer, depositing the additional insulating layer on the interlayer insulating layer, and then performing the CMP process, a subsequent process can be easily performed.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
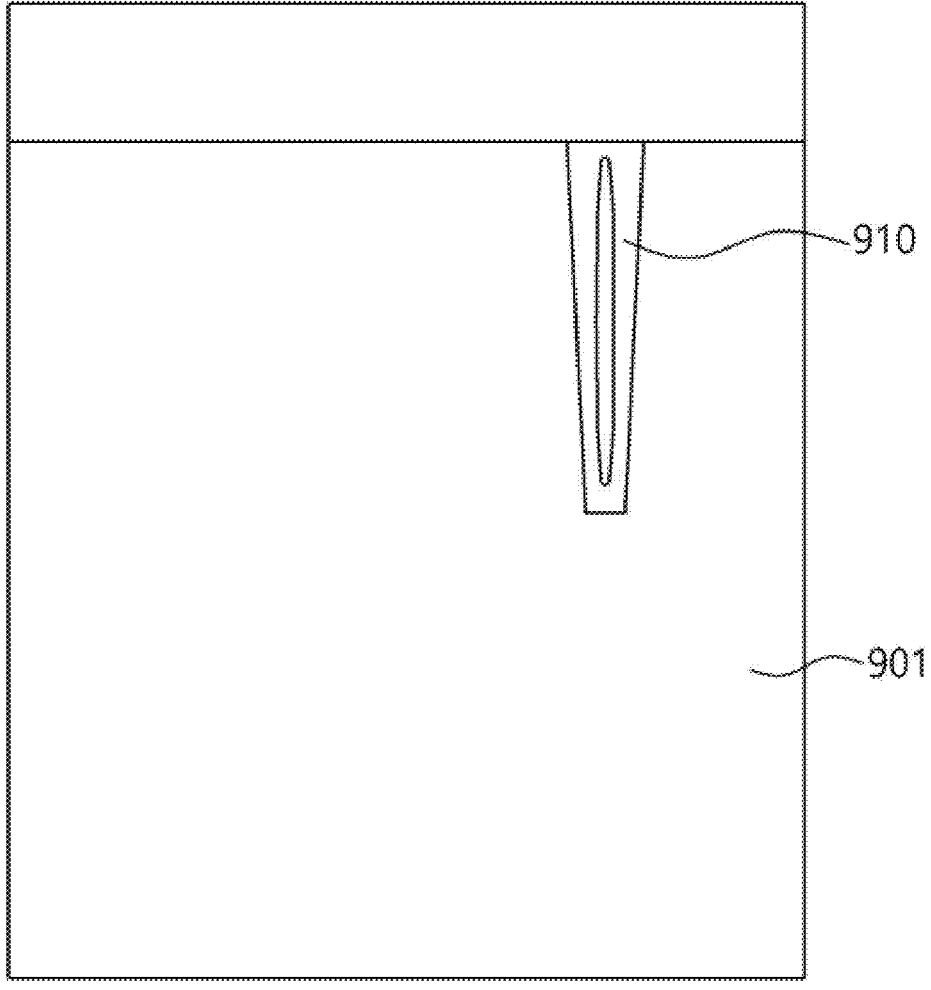
FIG. 1 is a reference sectional view illustrating that a DTI region is formed in a conventional semiconductor device.

Hereinafter, exemplary embodiments of the present disclosure will be described in more detail with reference to the accompanying drawings. The embodiments of the present disclosure can be modified in various forms. Therefore, the scope of the present disclosure should not be construed as being limited to the following embodiments, but should be construed on the basis of the descriptions in the appended claims. The embodiments of the present disclosure are provided for complete disclosure of the present disclosure and to fully convey the scope of the present disclosure to those ordinarily skilled in the art.

As used herein, when an element (or layer) is referred to as being disposed on another element (or layer), it can be disposed directly on the other element, or intervening element(s) (or layer(s)) may be disposed therebetween. In contrast, when an element is referred to as being directly disposed on or above another component, intervening element(s) are not located therebetween. Further, the terms "on", "above", "below", "upper", "lower", "one side", "side surface", etc. are used to describe one element's relationship to another element(s) illustrated in the drawings.

While the terms "first", "second", etc. may be used herein to describe various items such as various elements, regions and/or parts, these items should not be limited by these terms.

When a certain embodiment may be implemented differently, a specific process order may be performed differently from the described order. For example, two consecutively described processes may be performed substantially at the same time or performed in an order opposite to the described order.

The term "metal-oxide-semiconductor (MOS)" used herein is a general term. "M" is not limited to only metal and may include various types of conductors. "S" may be a substrate or a semiconductor structure. "O" is not limited to only oxide and may include various types of organic or inorganic materials.

In addition, the conductivity type or doped region of the elements may be defined as "P-type" or "N-type" according to the main carrier characteristics. However, this is only for convenience of description, and the technical spirit of the present disclosure is not limited to the above-mentioned examples. For example, "P-type" or "N-type" will hereinafter be used as the more general terms "first conductivity type" or "second conductivity type". Here, the first conductivity type means the P-type and the second conductivity type means the N-type.

It should be further understood that the terms "heavily doped" and "lightly doped" representing the doping concentration of an impurity region mean the relative doping concentrations of elements.

Figure 2:
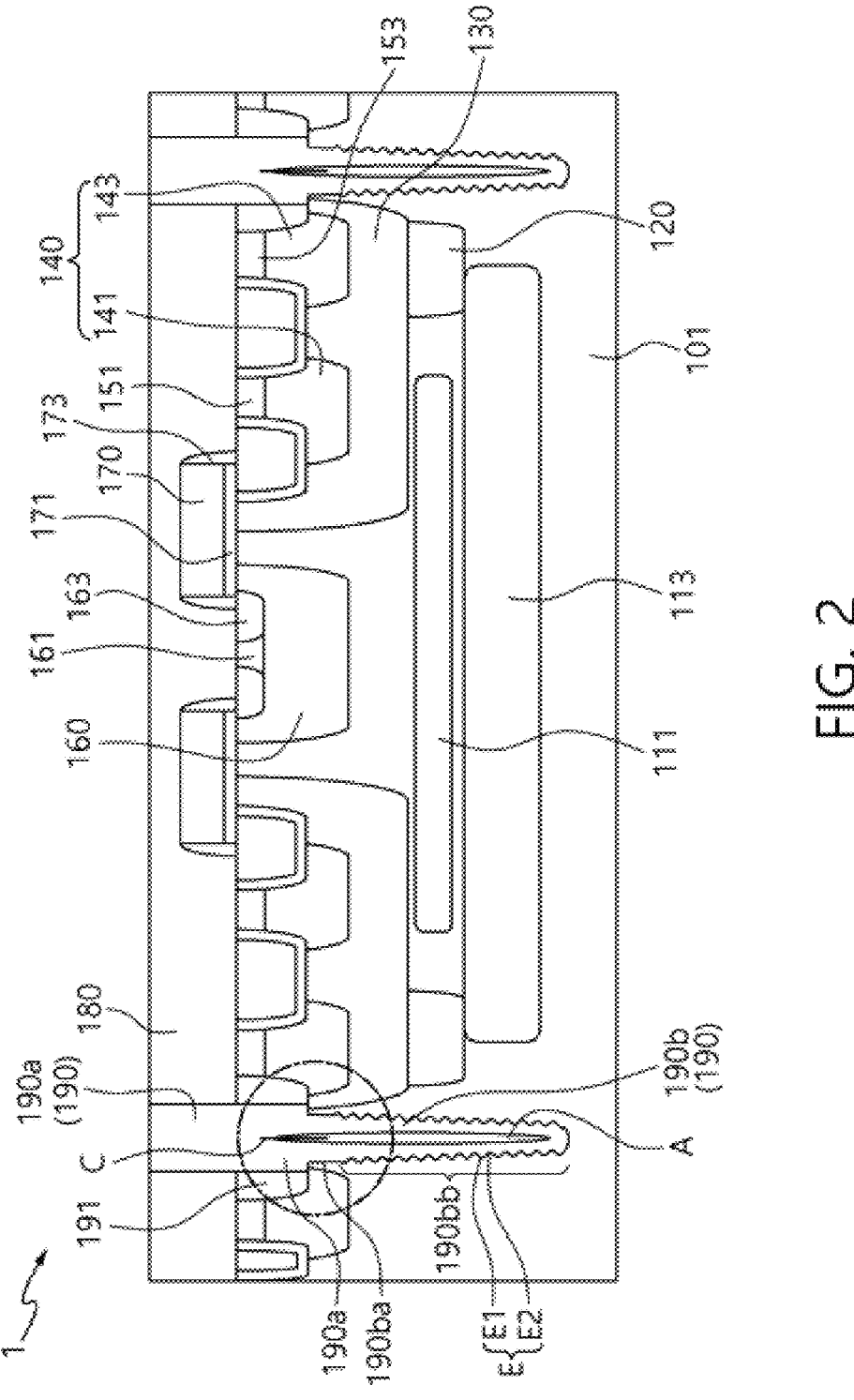
FIG. 2 is a sectional view illustrating a semiconductor device according to an embodiment of the present disclosure.

FIG. 2 is a sectional view illustrating a semiconductor device 1 according to an embodiment of the present disclosure.

Hereinafter, the semiconductor device 1 according to the embodiment of the present disclosure will be described in detail with reference to the accompanying drawings.

Referring to FIG. 2, the present disclosure relates to a semiconductor device 1. More specifically, the present disclosure relates to the semiconductor device 1, in which a first device isolation region 190 including a Pre-DTI region 190a and a DTI region 190b, the DTI region 190b is configured to be physically distinguishable by having a connection part 190ba with a substantially flat outer surface and an extension part 190bb with an outer surface including a concave and convex embossed portion E so that an air gap A in the first device isolation region 190 is prevented from being formed in an asymmetric shape and is prevented from being externally exposed in a subsequent process.

The first device isolation region 190 is preferably formed to have a vertical depth in the range of 10 μm to about 40 μm from a surface of the substrate 101, more preferably about 35 μm. It should, however, be noted that the present disclosure is not limited to the above example.

Hereinafter, the structure of the semiconductor device 1 according to the embodiment of the present disclosure will be described in detail.

The semiconductor device 1 may include a substrate 101. In the substrate 101, a well region used as an active region may be formed. This well region may be defined by a second device isolation region 191 serving as a device isolation layer. In addition, the substrate 101 may be a substrate of the first conductivity type, may be a diffusion region of the first conductivity type disposed in a substrate, or may include an epitaxial layer of the first conductivity type formed by epitaxial growth on a substrate. The second device isolation region 191 may be formed by a shallow trench isolation (STI) process, but is not limited thereto.

The semiconductor device 1 may include a first buried layer 111 and a second buried layer 113 in the substrate 101. For example, the first buried layer 111 may be formed above the second buried layer 113. In addition, a high voltage well region 120 may be formed to be connected to a side of the second buried layer 113. The high voltage well region 120 may be an ion implantation region (HVNWELL) of second conductivity type, and may be formed in the substrate 101 and on the second buried layer 113.

The first buried layer 111 may be an impurity region of the first conductivity type, and the second buried layer 113 may be an impurity region of second conductivity type. It should be noted that the first buried layer 111 and the high voltage well region 120 are not essential components of the present disclosure and may be omitted in some cases.

A deep well region 130 may be formed in the substrate 101 and on the high voltage well region 120. The deep well region 130 may have a side, preferably, a bottom portion connected to the high voltage well region 120, and may be an impurity region (DNWELL) of second conductivity type. In some cases, the deep well region 130 may be formed to be directly connected to the second buried layer 113. In this case, the bottom portion of the deep well region 130 may be connected to the second buried layer 113.

In addition, a pair of well regions 140 of the second conductivity type may be formed to be spaced apart in the deep well region 130. A drain region 151 may be formed in a first well region 141, and a heavily doped region 153 may be formed in a second well region 143. The drain region 151 may be an impurity region of second conductivity type, and may be doped with a higher concentration of impurities than the first well region 141. Also, the heavily doped region 153 may be an impurity region of second conductivity type, and may be doped with a higher concentration of impurities than the second well region 143.

The drain region 151 and the heavily doped region 153 are preferably formed in the surface of the substrate 101. The heavily doped region 153 may function as a guard ring together with the second well region 143 to reduce current leakage and improve the safe operating area (SOA) of the device. The drain region 151 may be electrically connected to a drain electrode (not illustrated). The first well region 141 surrounding the drain region 151 may be a drain extension region and may improve breakdown voltage characteristics of a high-voltage semiconductor device.

A body region 160 may be formed in the substrate 101. The body region 160 may be a heavily doped region of the first conductivity type, and may be formed to be spaced apart from the deep well region 130. In addition, a source region 163 may be formed in the body region 160 and in the surface of the substrate 101. The source region 163 may be a heavily doped region of the first conductivity type and may be electrically connected to a source electrode (not illustrated). In addition, a body contact region 161 may be formed in the body region 160 at a position adjacent to or in contact with the source region 163. The body contact region 161 may be a heavily doped region of the first conductivity type.

A gate electrode 170 may be formed on the substrate 101. For example, the gate electrode 170 may be formed between the drain region 151 and the source region 163 in the active region. The gate electrode 170 may be positioned on a channel region. The channel region may be turned on or off in response to a gate voltage applied to the gate electrode 170. The gate electrode 170 may include any one of conductive polysilicon, metal, conductive metal nitride, and a combination thereof, and may be formed by a CVD, PVD, ALD, MOALD, or MOCVD process.

In addition, a gate insulating layer 171 may be formed between the gate electrode 170 and the surface of the substrate 101. The gate insulating layer 171 may include any one of a silicon oxide layer, a high-k dielectric layer, and a combination thereof. In addition, the gate insulating layer 171 may be formed by an ALD, CVP, or PVD process.

In addition, a sidewall of the gate electrode 170 may be covered by a gate spacer 173. The gate spacer 173 may include any one of an oxide layer, a nitride layer, and a combination thereof.

In addition, an interlayer insulating layer 180 may be formed on the substrate 101 to entirely cover the gate electrode 170. The interlayer insulating layer 180 may be, for example, a borophosphosilicate glass (BPSG) layer or a tetraethyl orthosilicate (TEOS) layer, but the present disclosure is not limited thereto.

The second device isolation region 191 may be formed from the surface of the substrate 101 to a predetermined depth. The second device isolation region 191 may be a device isolation layer defining the active region as described above, and may be formed by, for example, an STI process. In addition, the first device isolation region 190 may be formed to extend from the surface of the substrate 101 to a predetermined depth. Although in the drawings the first device isolation region 190 is illustrated as being formed to pass through the second device isolation region 191, it should be noted that the present disclosure is not limited thereto and the first device isolation region 190 and the second device isolation region 191 may be formed at independent positions. When the first device isolation region 190 is formed to overlap the second device isolation region 191, there is an advantage in that a reduction in the area of the active region is prevented as much as possible, and direct damage to the substrate 101 is prevented as much as possible during an etching process for the first device isolation region 190. The first device isolation region 190 may be formed in a structure passing through the interlayer insulating layer 180 and, in some cases, the second device isolation region 191.

The first device isolation region 190 may include the Pre-DTI region 190a defined in a top portion thereof and the DTI region 190b extending from the Pre-DTI region 190a. The Pre-DTI region 190a may pass through or at least partially overlap the interlayer insulating layer 180 and, in some cases, the second device isolation region 191. The Pre-DTI region 190a may be formed, for example, such that a bottom portion thereof is located at the substantially same or similar height as a bottom portion of the second device isolation region 191. In addition, when forming the first device isolation region 190 to overlap the second device isolation region 191, it is preferable that the Pre-DTI region 190a is formed to have a horizontal width narrower than that of the second device isolation region 191.

In addition, the DTI region 190b may be formed under the Pre-DTI region 190a to be connected to the bottom portion of the Pre-DTI region 190a. The DTI region 190b may be formed such that a side thereof is at least partially inclined to become gradually narrower downward rather than extending in the vertical direction. This is because the etch strength decreases as the etch depth increases during a Bosch process which will be described later. On the contrary, the DTI region 190b may extend downward with a substantially uniform width or may be formed to include a portion that becomes gradually wider downward, but the present disclosure is not limited thereto. In addition, the DTI region 190b may be formed to have a horizontal width narrower than that of the Pre-DTI region 190a. Both the Pre-DTI region 190a and the DTI region 190b are preferably gap-filled with the same material as the interlayer insulating layer 180, but the present disclosure is not limited thereto.

In addition, the air gap A may be formed in the first device isolation region 190. For example, the air gap A may be formed from a position adjacent to a bottom portion of the DTI region 190b to a position adjacent to a top portion of the DTI region 190b, and alternatively, may be formed to have a top end extending to a side of the Pre-DTI region 190a. In addition, the air gap A is preferably not formed to a position adjacent to a top portion of the Pre-DTI region 190a. This is to prevent a metal material such as tungsten (W) from penetrating into the air gap A in a subsequent process for forming a contact, thereby preventing deterioration of device characteristics.

Unlike the present disclosure in which the first device isolation region 190 is formed by dividing into the Pre-DTI region 190a and the DTI region 190b, when forming a DTI region by forming a trench by a one-time process and then gap-filling the inside of the trench, there is a technical limit in the formation depth of the trench. That is, when forming the DTI region by etching the substrate 101 one time, the formed DTI region may have a depth insufficient to electrically isolate adjacent devices. In addition, it is inevitably difficult to gap-fill an insulating layer deep within the trench in a subsequent process. In particular, when the substrate 101 is formed to be relatively deep in order to realize a high breakdown voltage (BV) of 100 V or more, the DTI region cannot be formed deep. This leads to an increase in electric field below the DTI region and an increase in current leakage, resulting in a decrease in breakdown voltage (BV) characteristics. Thus, the distance between adjacent devices is increased to prevent noise generation therebetween, thereby inevitably increasing the overall chip size.

In order to solve the above problems, the semiconductor device 1 according to the embodiment of the present disclosure is characterized in that the formation of the first device isolation region 190 including the DTI region 190b is accomplished by forming the Pre-DTI region 190a having a wide width and then forming the DTI region 190b having a relatively narrow width through an additional etching process, whereby the first device isolation region 190, in particular, the DTI region 190b, is formed with a sufficient depth.

Figure 3:
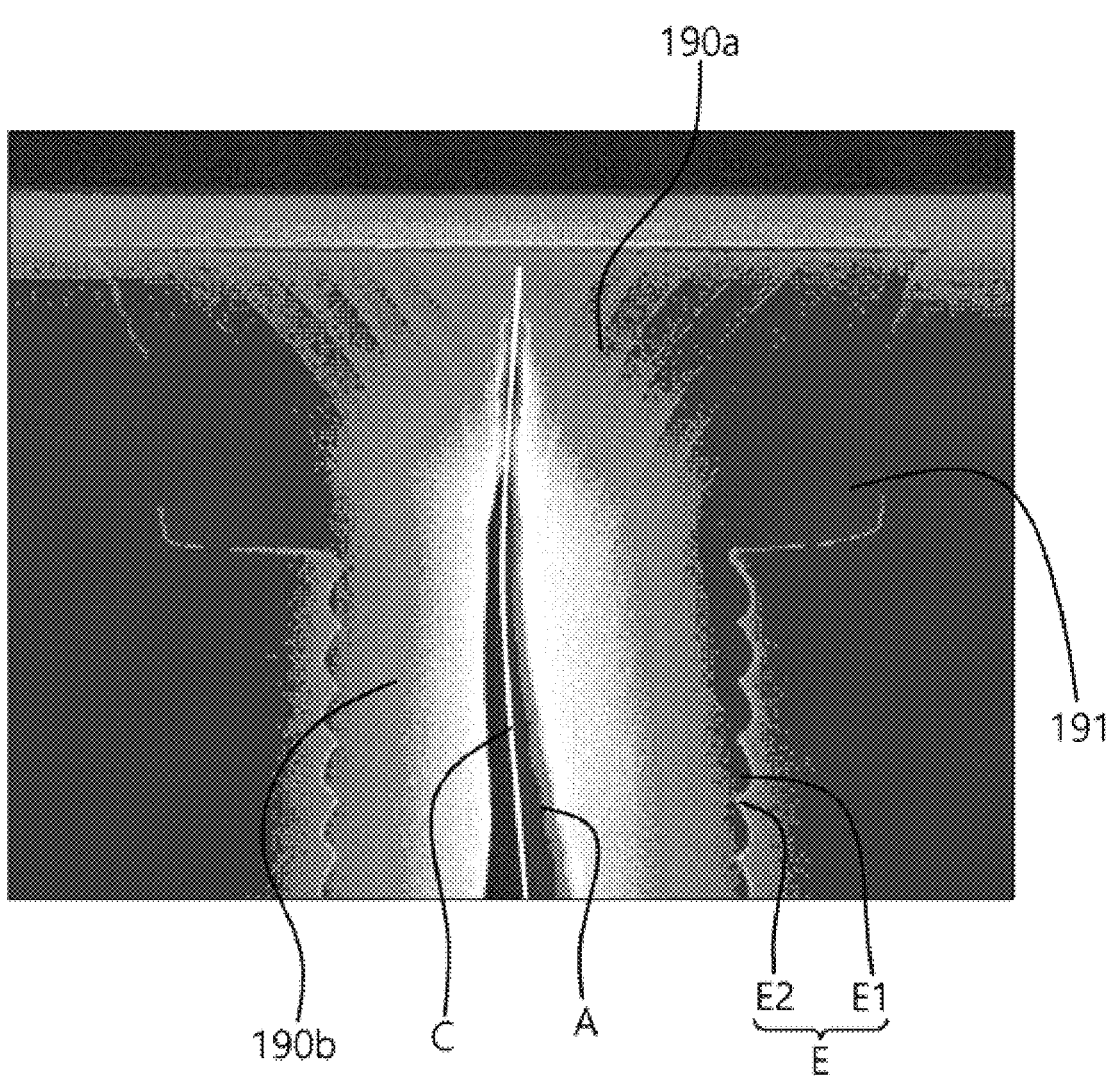
FIG. 3 is an image illustrating an air gap structure formed after performing a Bosch process for forming a DTI region illustrated in FIG. 2.
Figure 4:
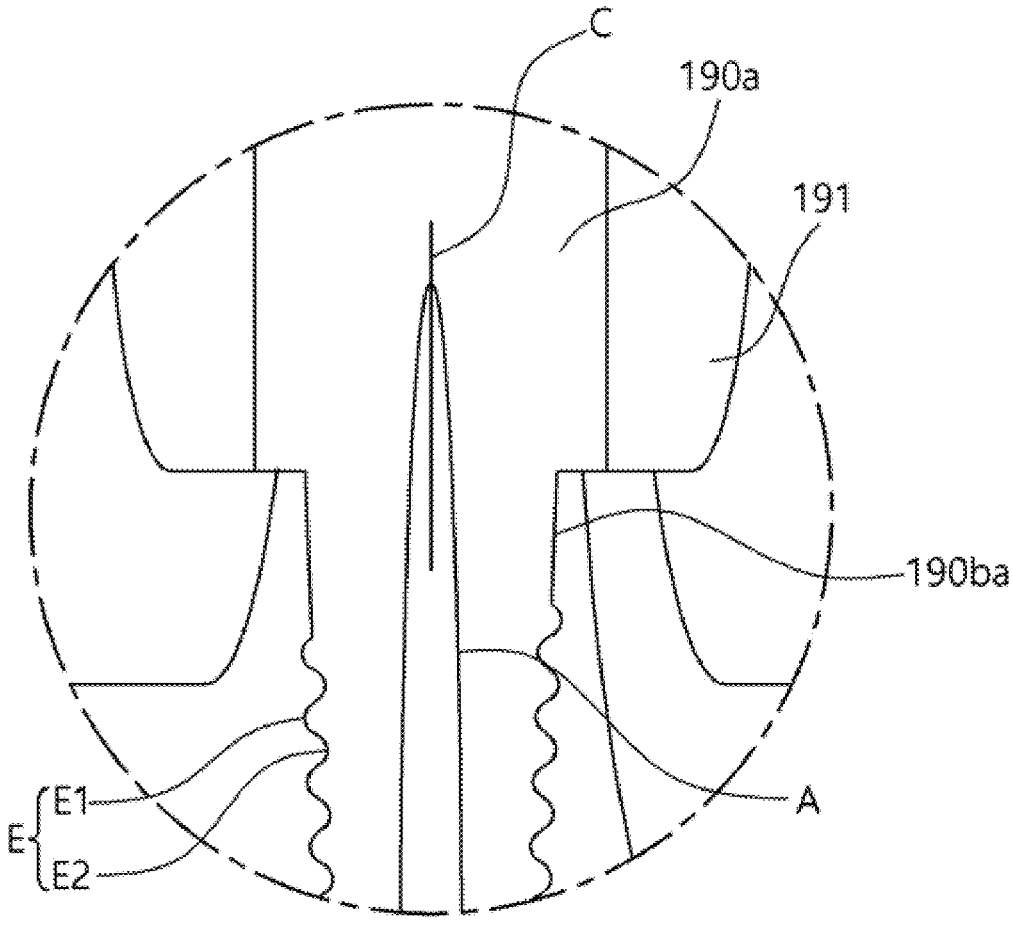
FIG. 4 is a view illustrating an air gap structure formed after forming a connection part and an extension part illustrated in FIG. 2.

FIG. 3 is an image illustrating an air gap structure formed after performing the Bosch process for forming the DTI region 190b illustrated in FIG. 2; and FIG. 4 is a view illustrating an air gap structure formed after forming the connection part 190ba and the extension part 190bb illustrated in FIG. 2.

Hereinafter, a structure that may be formed when the DTI region 190b is formed by a general Bosch process, problems resulting therefrom, and features of the present disclosure to solve the problems will be described in detail.

Referring to FIG. 3, as described above, the first device isolation region 190 having the Pre-DTI region 190a and the DTI region 190b is formed to have a depth of several tens of μm, for example, in the range of about 10 μm to 40 μm, from the surface of the substrate 101. Therefore, in order to achieve deep Si etching, etching is performed through the Bosch process when forming the DTI region 190b. The Bosch process is a cyclic process in which etching and deposition are alternately performed. A protection layer is deposited first, and then the protection layer on a bottom surface of a pattern and a silicon substrate are etched. This process is repeated to form a trench.

Briefly describing the process of forming the first device isolation region 190, the surface of the substrate 101 is etched first to form a trench where the Pre-DTI region 190a is to be formed, and then the substrate 101 is etched from a bottom portion of the trench through the Bosch process to form a trench where the DTI region 190b is to be formed. At this time, due to the nature of the Bosch process, the embossed portion E having an uneven or continuous water drop shape is inevitably formed on an inner wall of the trench where the DTI region 190b is to be formed. That is, a concave portion E1 and a convex portion E2 are repeatedly formed on the inner wall of the trench where the DTI region 190b is to be formed along the vertical direction.

In this case, the concave portion E1 and the convex portion E2 may be irregularly formed on left and right sidewalls of the trench where the DTI region 190b is to be formed, resulting in the sidewalls being laterally asymmetric at the same height (or depth). For example, the concave portion E1 and the convex portion E2 may be formed on the left sidewall and the right sidewall, respectively, at the same height of the trench where the DTI region 190b is to be formed, and alternatively, the concave portion E1 or the convex portion E2 may be formed with different vertical lengths on the left sidewall and the right sidewall, respectively, at the same height. Thus, the inner wall of the trench which is where the DTI region 190b is to be formed and is connected to the trench where the Pre-DTI region 190a is to be formed, in particular, the inner wall of a top portion of the trench where the DTI region 190b is to be formed may be formed in a laterally asymmetric shape. As a result, a central axis C of the trench where the DTI region 190b is to be formed is distorted in the vertical direction.

In this state, when a gap-filling process of filling an insulating layer in the trench where the DTI region 190b is to be formed is performed to form the first device isolation region 190, the air gap A may be formed in a laterally asymmetric shape rather than extending straight in the vertical direction, or a top end thereof may extend to a position adjacent to a top end of the Pre-DTI region 190a (see FIG. 3). In this state, when a subsequent process such as a CMP process is performed, the top end of the air gap A may be exposed to the outside. This inevitably results in the problem in which a metal material such as tungsten (W) penetrates into the air gap A in a subsequent process for forming a contact and deteriorates device characteristics.

Referring to FIGS. 2 and 4, in order to prevent the above problem, the semiconductor device 1 according to the embodiment of the present disclosure is characterized by including: the connection part 190ba directly connecting the DTI region 190b to the Pre-DTI region 190a; and the extension part 190bb connected to a bottom portion of the connection part 190ba and extending downward. The connection part 190ba and the extension part 190bb may be formed by gap-filling an insulating layer in trenches (second trench and third trench) formed by different etching processes. Here, the etching process for forming the second trench is referred to as a "first etching process", and the etching process for forming the third trench is referred to as a "second etching process", and it should be noted that the first etching process and the second etching process are different from each other.

First, the connection part 190*ba* may define a top portion of the DTI region 190*b* and may connect the Pre-DTI region 190*a* and the extension part 190*bb* to each other. In addition, the connection part 190*ba* may be formed by filling an insulating layer in a second trench Tb (see FIG. 7) formed through a general Si etching process, for example, dry etching (non-Bosch process), which is the first etching process, so that an outer surface of the connection part 190*ba* in contact with the substrate 101 is formed substantially flat. In addition, the extension part 190*bb* may be formed by filling an insulating layer in a third trench Tc (see FIG. 8) formed through, for example, the Bosch process, which is the second etching process, so that an outer surface of the extension part 190*bb* in contact with the substrate 101 has the embossed portion E formed in the vertical direction. As described above, by forming at least a top outer surface of the DTI region 190*b* to be substantially flat and symmetrical, it is possible to secure a regular profile of the air gap A. That is, it is possible to prevent the top end of the air gap A from being formed to be laterally asymmetric shape or extending to a position adjacent to the top end of the Pre-DTI region 190*a*.

FIGS. 5 to 15 are sectional views illustrating a method of manufacturing a semiconductor device according to an embodiment of the present disclosure.

Hereinafter, the method of manufacturing the semiconductor device according to the embodiment of the present disclosure will be described in detail with reference to the accompanying drawings. For convenience of description, descriptions well regions, a buried layer, a source region, and a drain region in a substrate, a gate electrode a dummy gate on the substrate will be omitted, and processes before and after formation of a second device isolation region 191 will be mainly described.

Figure 5:
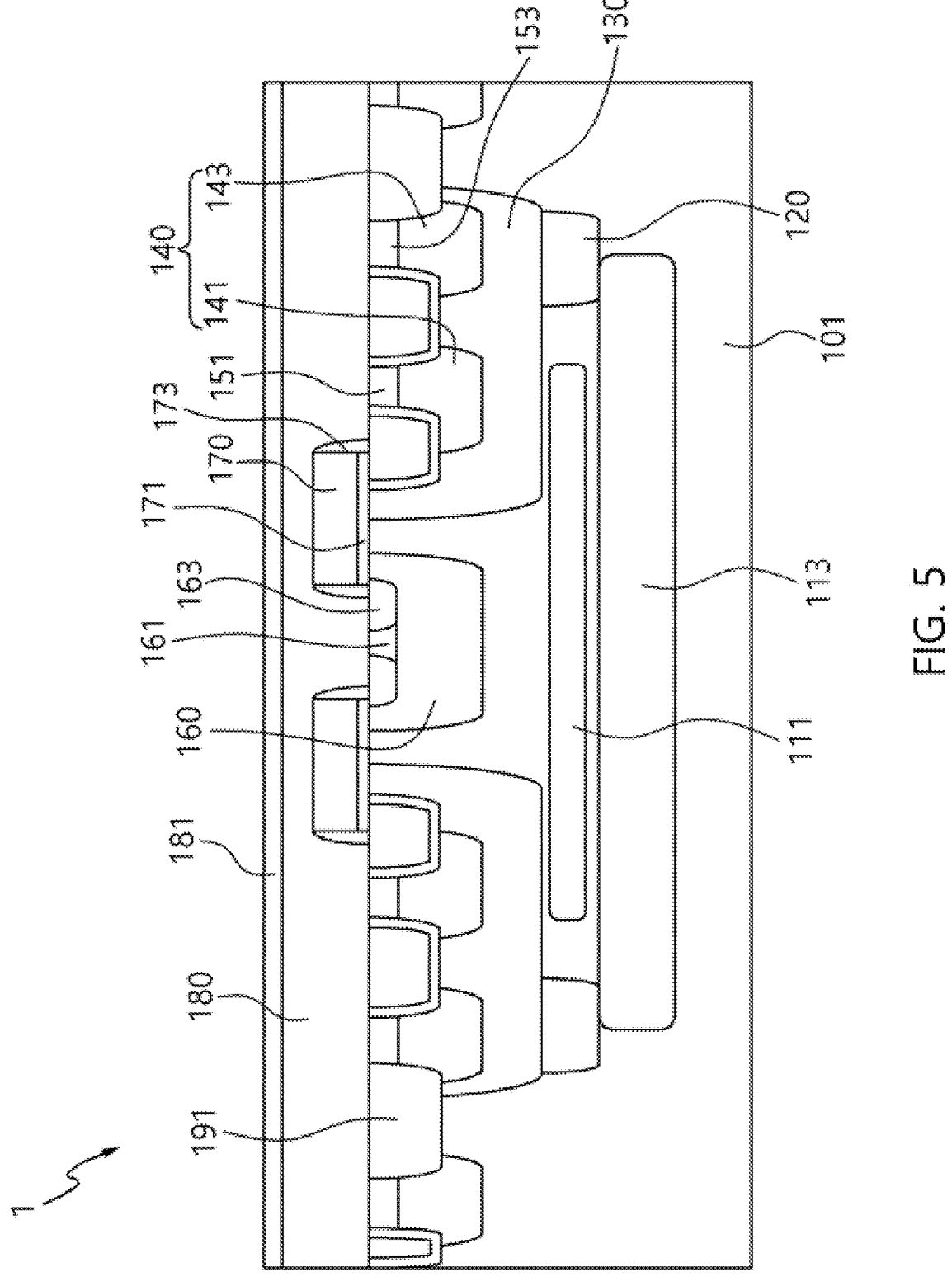
FIGS. 5 to 15 are sectional views illustrating a method of manufacturing a semiconductor device according to an embodiment of the present disclosure.

Referring to FIG. 5, first, an interlayer insulating layer 180 may be deposited on a substrate 101 on which a gate electrode 170 is formed. As described above, the interlayer insulating layer 180 may include, for example, a BPSG layer or a TEOS layer, but is not limited thereto. Thereafter, an etch stop layer 181 may be formed on the interlayer insulating layer 180. The etch stop layer 181 may be a CMP etch stop layer in a subsequent CMP process, and may be, for example, an SiN layer.

Figure 6:
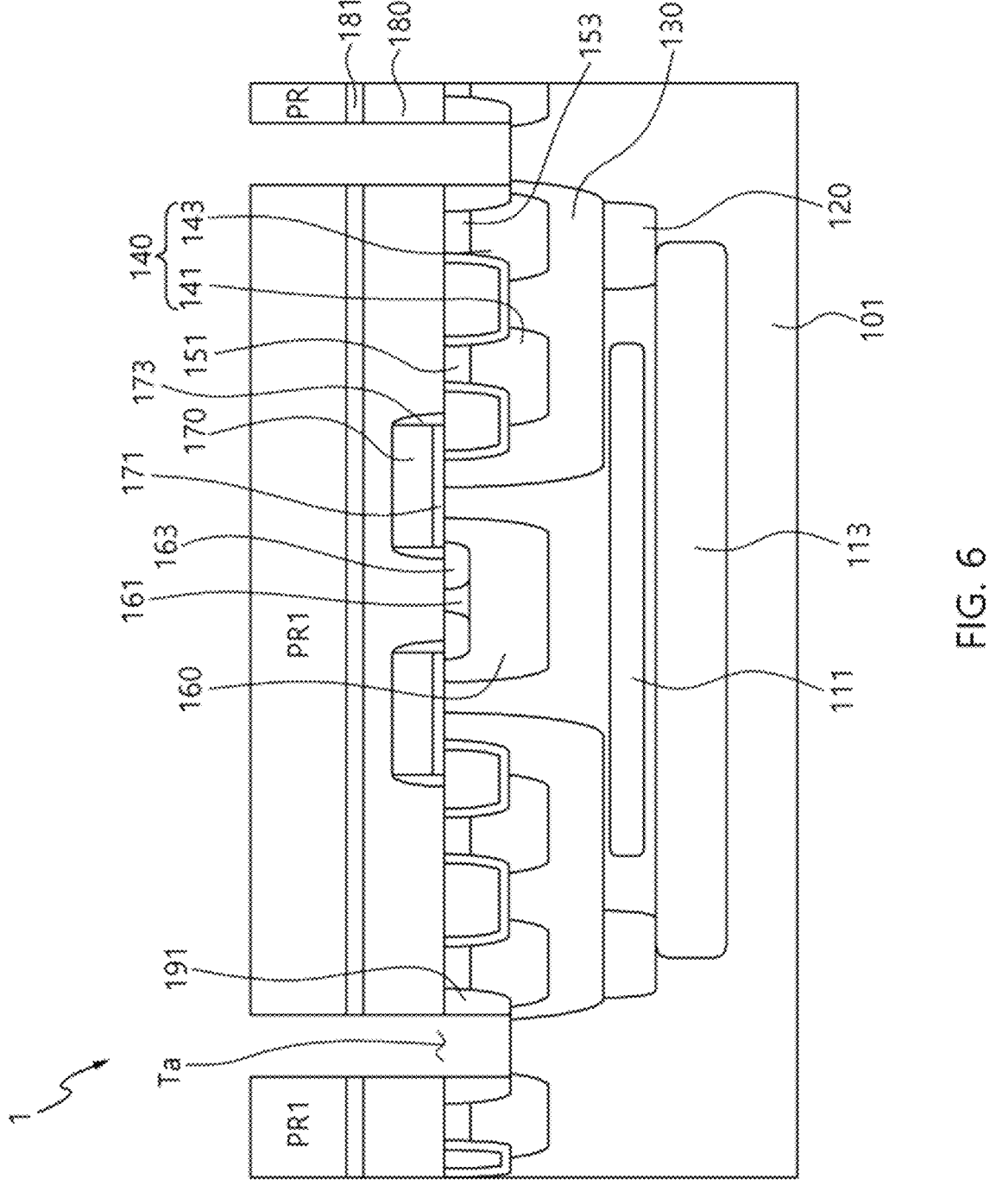

Then, referring to FIG. 6, a first trench Ta where a Pre-DTI region 190*a* is to be formed may be formed by etching the substrate 101. At this time, in some cases, the etch stop layer 181, the interlayer insulating layer 180, and the second device isolation region 191 may be etched so that the first trench Ta partially overlaps the second device isolation region 191 in the vertical direction, but the present disclosure is not limited thereto.

The process of forming the first trench Ta will be described in detail. For example, a photoresist layer PR1 may be patterned on the etch stop layer 181 so that there is an opening in which the first trench Ta is to be formed. The etch stop layer 181, the interlayer insulating layer 180, and the second device isolation region 191 may then be sequentially etched to form the first trench Ta.

After the first trench Ta is formed, the photoresist layer PR1 may be removed. This may be achieved through a PR strip process and a cleaning process.

Figure 7:
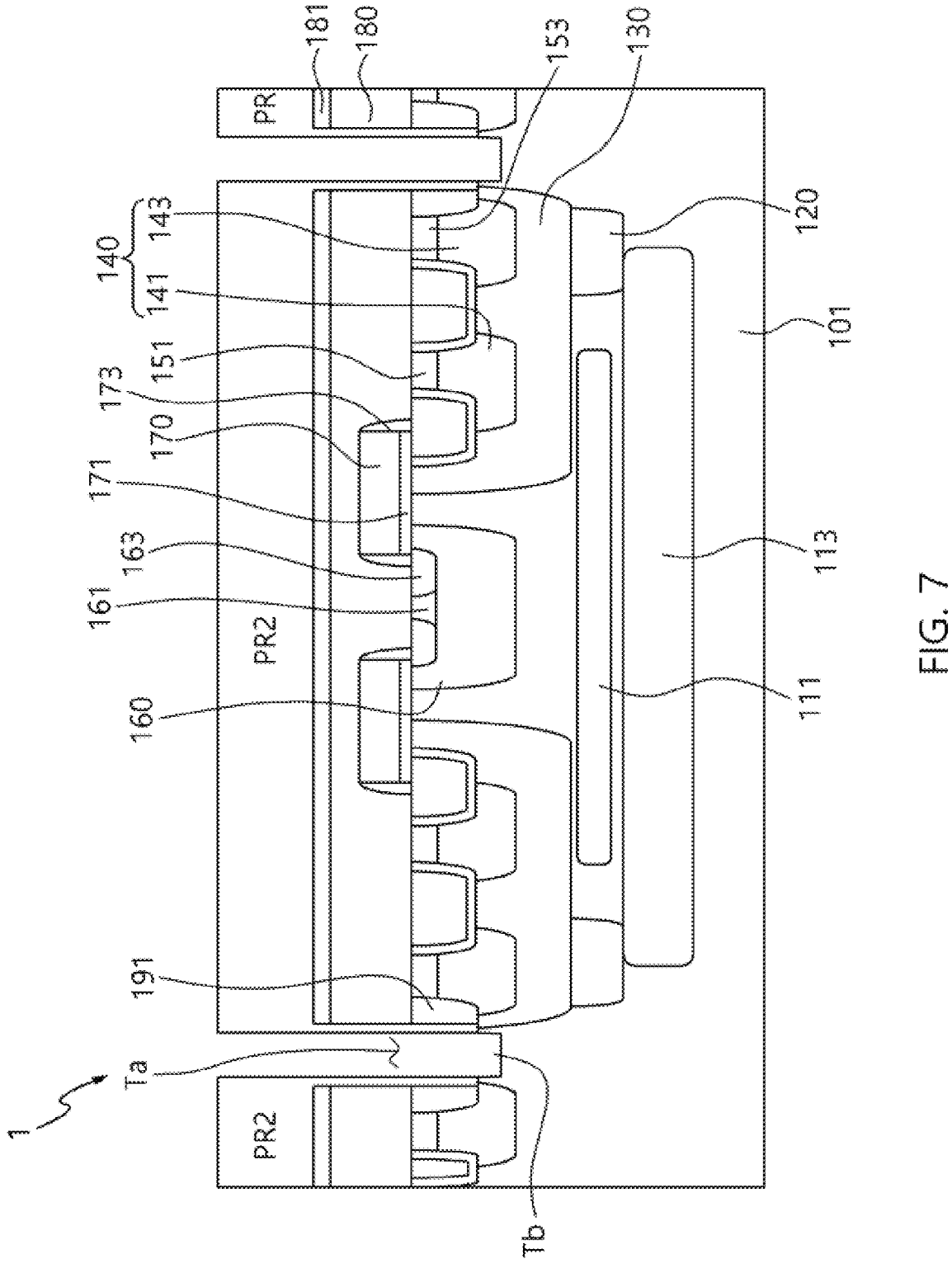

Then, referring to FIG. 7, a second trench Tb where a connection part 190*ba* is to be formed may be formed in a DTI region 190*b*. The second trench Tb is preferably formed through a first etching process, more preferably through a non-Bosch process. The second trench Tb may be connected to a bottom portion of the first trench Ta. The process of forming the second trench Tb will be described in detail. For example, a photoresist layer PR2 may be patterned on the etch stop layer 181 and along an inner wall of the first trench Ta. That is, the photoresist layer PR2 may be patterned such that there is an opening having a horizontal width substantially corresponding to that of the uppermost end of the second trench Tb. Thereafter, the substrate 101 may be etched from the bottom portion of the first trench Ta. Here, the etching depth is preferably equal to or less than about 10000 A, more preferably equal to or less than about 5000 A. The etching depth may be, for example, in the range of 2000 A to 5000 A.

Figure 8:
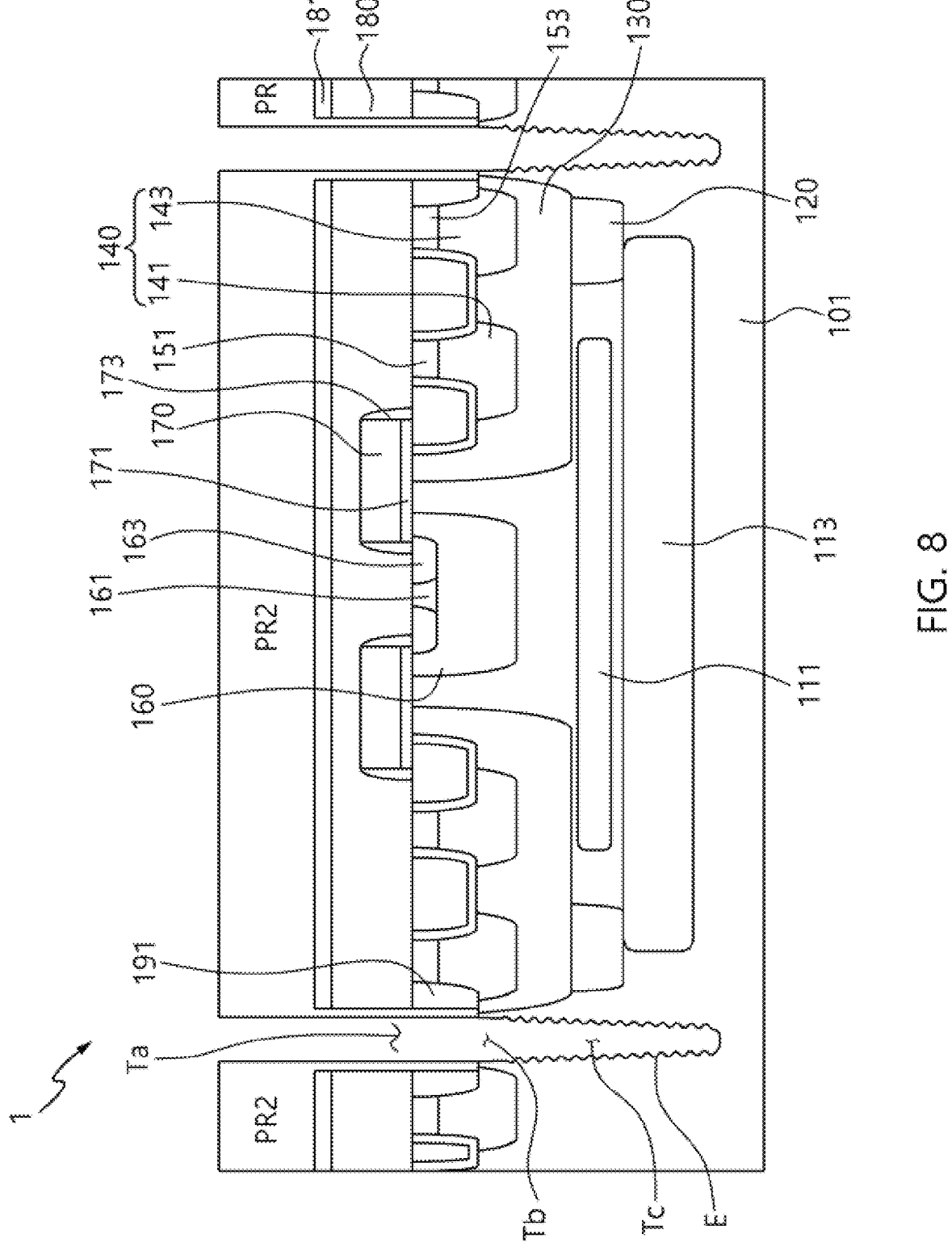

Then, referring to FIG. 8, a third trench Tc where an extension part 190*bb* is to be formed may be formed by performing a Bosch process without removing the photoresist layer PR2. The third trench Tc may be formed to a depth in the range of 10 μm to 40 μm from a surface of the substrate 101. In addition, an inner wall of the third trench Tc may be formed to have an uneven or continuous water drop shape in the vertical direction. That is, an embossed portion E may be formed on the inner wall of the third trench Tc. The third trench Tc is preferably formed through a second etching process, more preferably through the Bosch process.

Figure 9:
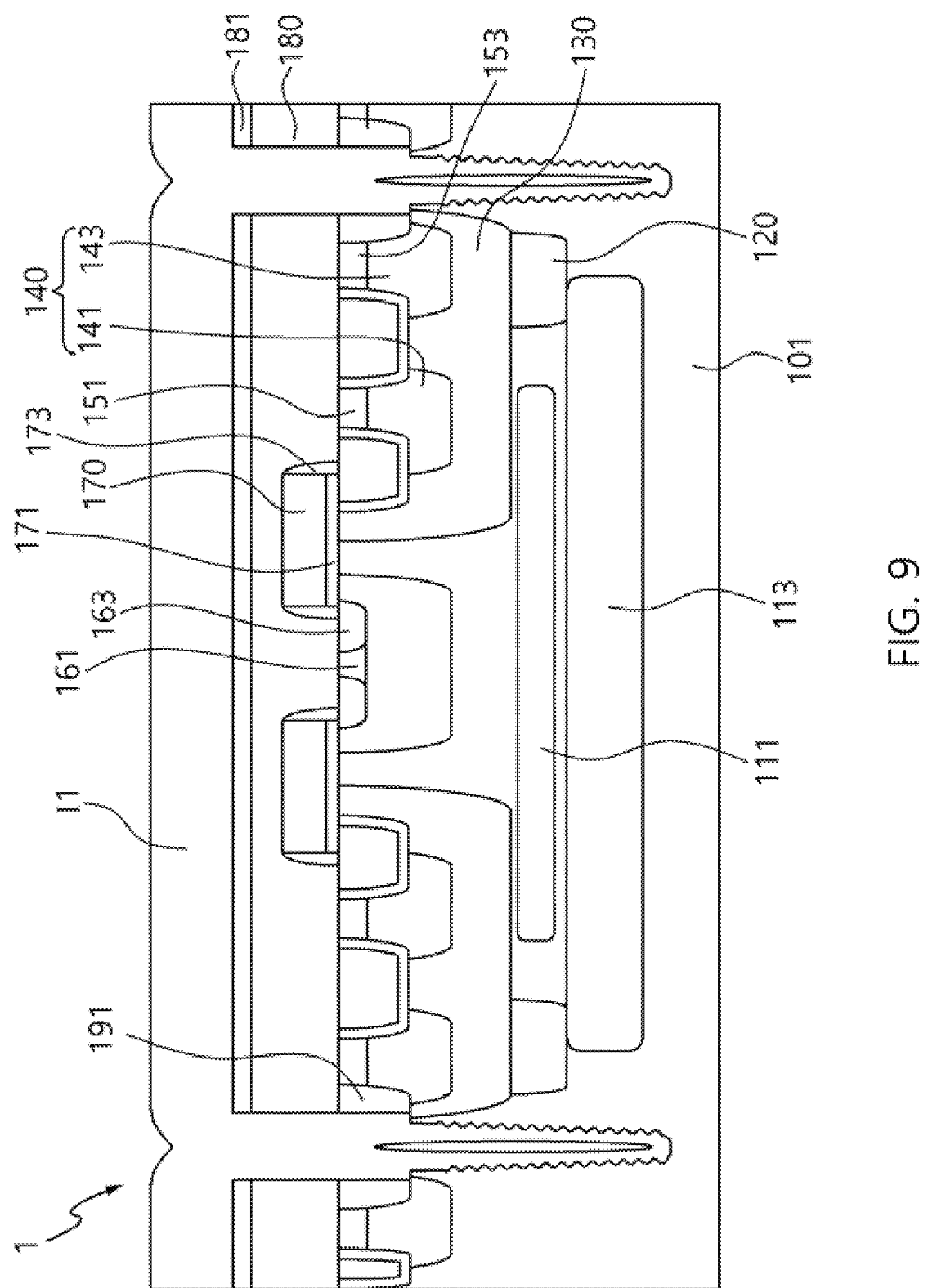

Then, referring to FIG. 9, a first insulating layer I1 may be deposited on the etch stop layer 181 and gap-filled in the first to third trenches Tc. The first insulating layer I1 may be a TEOS layer, but is not limited thereto, and may be an arbitrary oxide layer. By this process, the first insulating layer I1 may be deposited on the etch stop layer 181. In addition, the first insulating layer I1 may be filled in the first to third trenches Ta to Tc.

Figure 10:
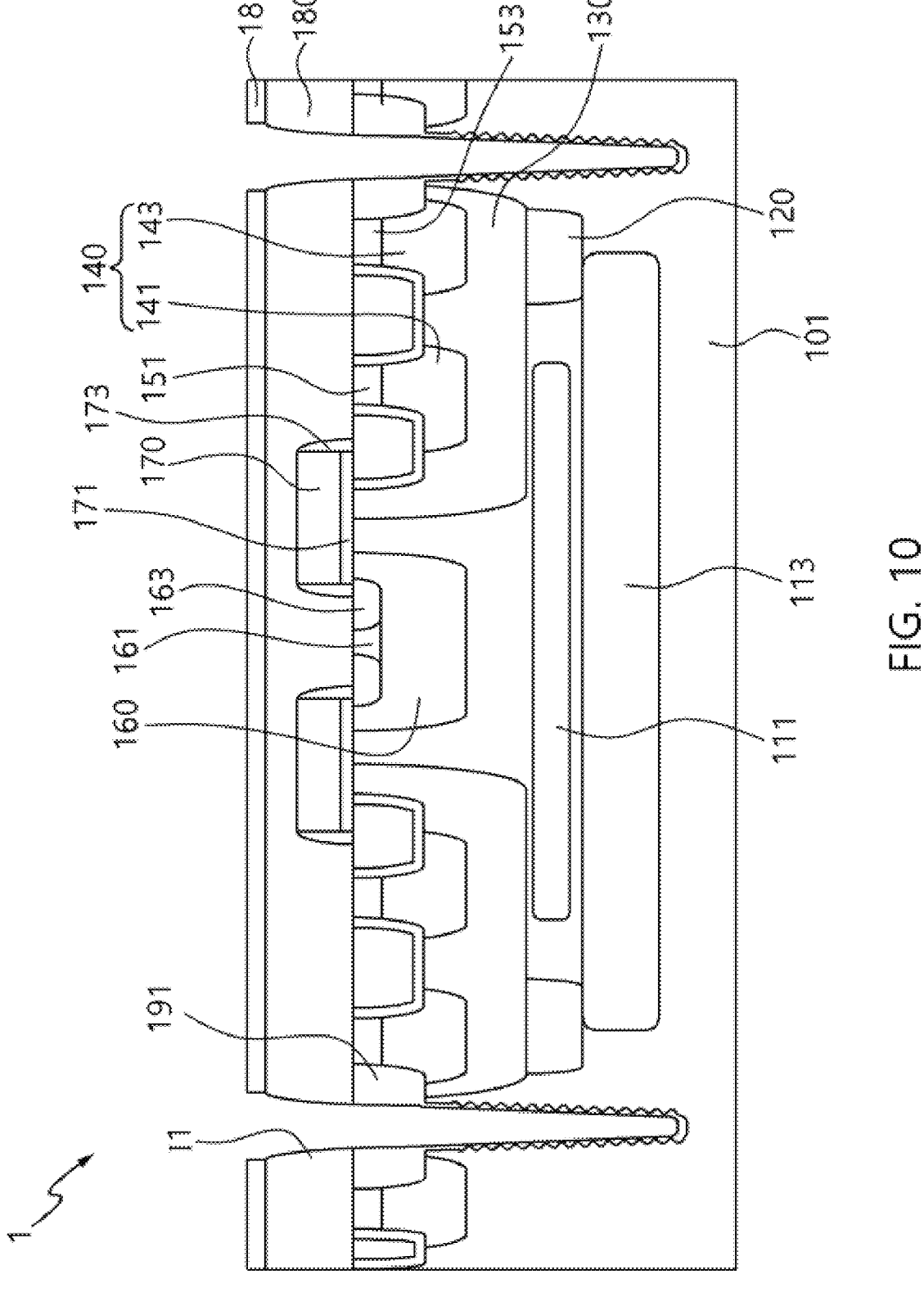

Then, referring to FIG. 10, the deposited first insulating layer I1 may be subjected to an etch-back process. The etch-back process is a process of at least partially etching the first insulating layer I1 on the etch stop layer 181 and in the first to third trenches Ta to Tc. By this process, the first insulating layer I1 may be formed in a side-wall shape in the first trench Ta, and the first insulating layer I1 may remain with a predetermined thickness along an inner wall of the second trench Tb and the third trench Tc.

Figure 11:
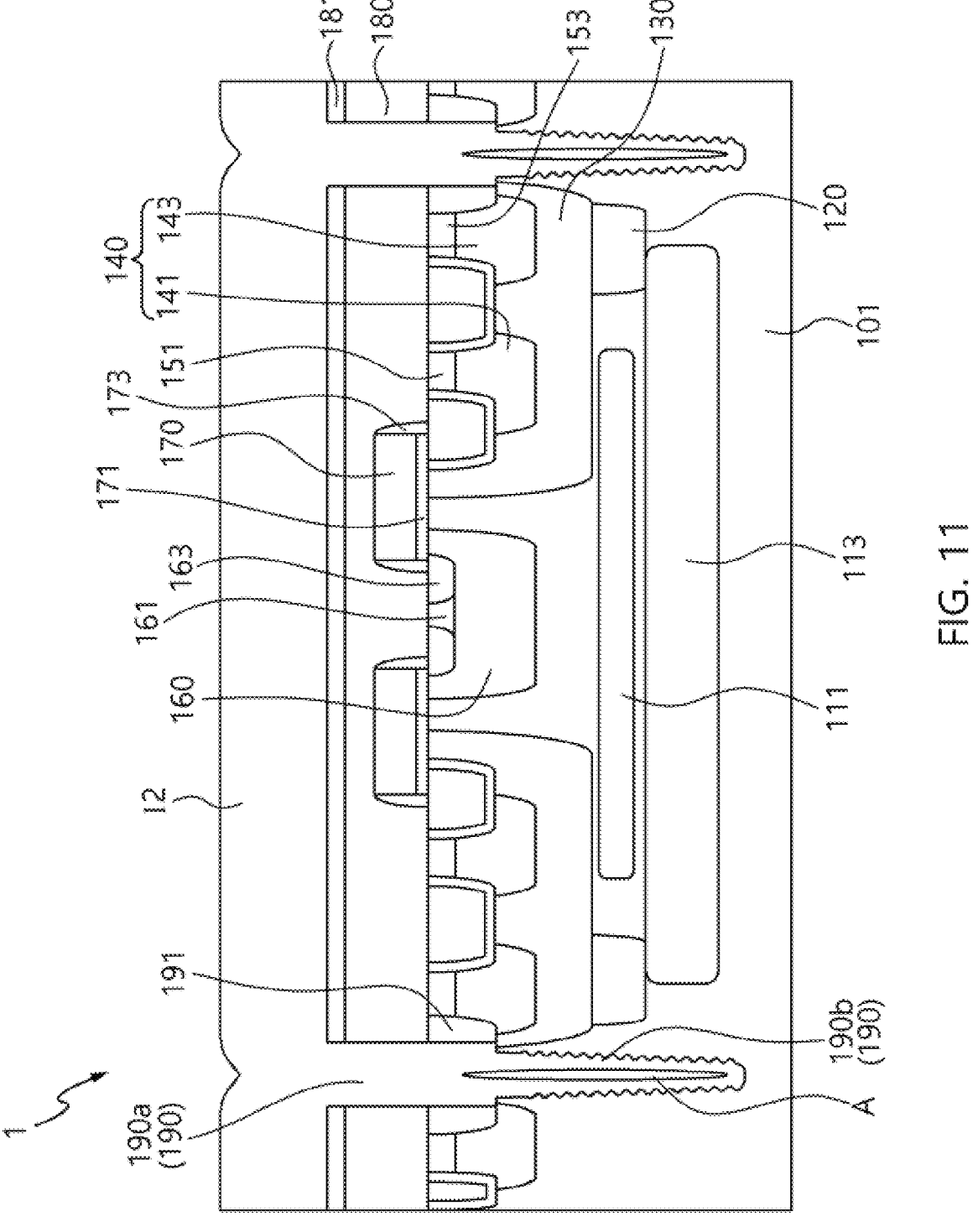

Then, referring to FIG. 11, a second insulating layer I2 may be deposited on the etch stop layer 181 and gap-filled in the first to third trenches Ta to Tc. As a result of the deposition of the second insulating layer I2 as described above, an air gap A may be formed inside the first to third trenches Ta to Tc to prevent of noise generation between adjacent devices so as to be electrically stable. The second insulating layer I2 may include the same material as the first insulating layer I1, but the present disclosure is not limited thereto.

The air gap A is preferably formed such that a top end thereof is positioned below a top surface of the interlayer insulating layer 180 at a height suitable for preventing penetration of tungsten (W) or the like in a subsequent process. By this process, the Pre-DTI region 190*a* and the DTI region 190*b* may be completed. In addition, the second insulating layer I2 may include the same material as the first insulating layer I1, but is not limited thereto, and may be an arbitrary oxide layer.

Figure 12:
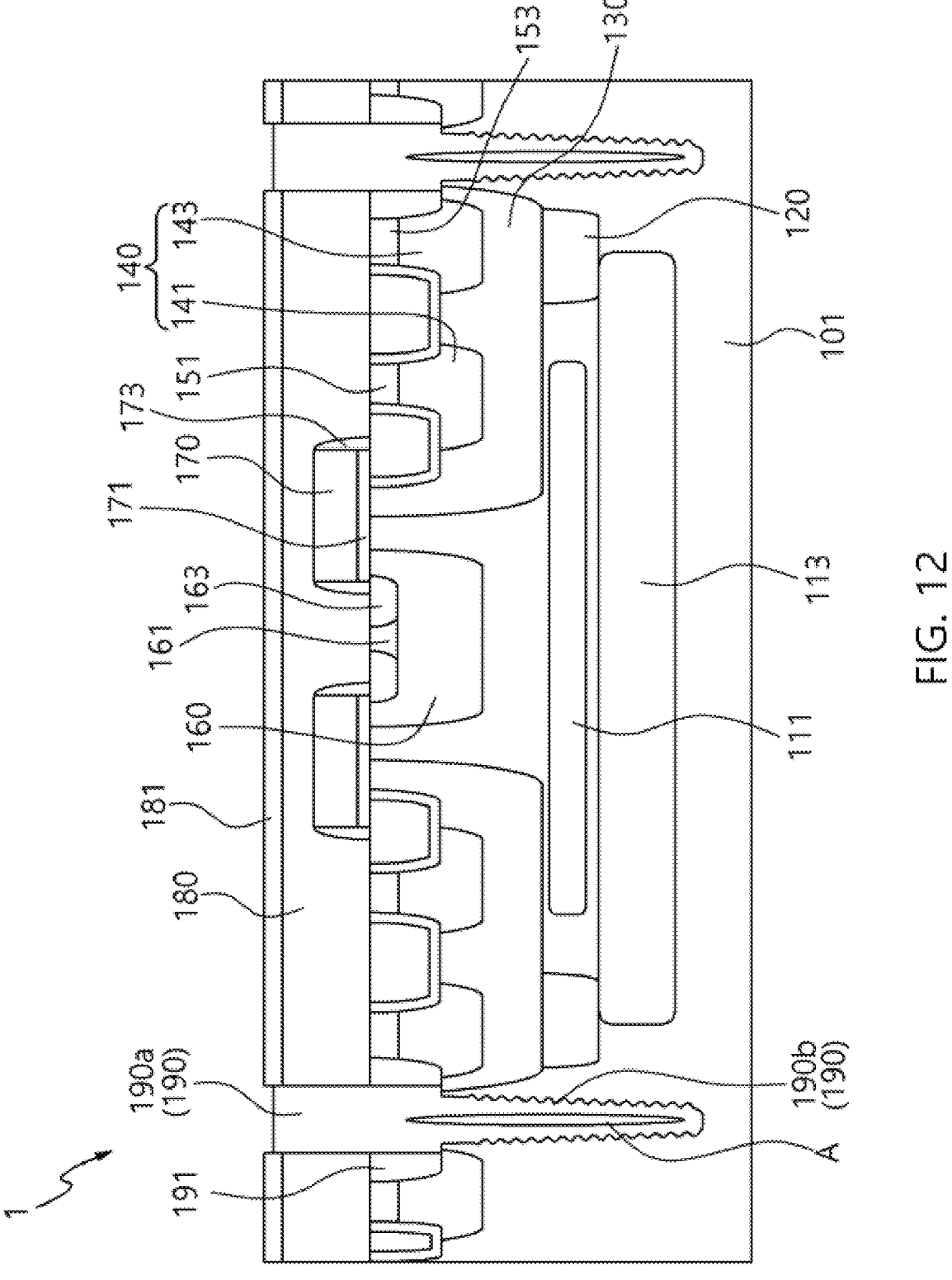

Then, referring to FIG. 12, the second insulating layer I2 on the etch stop layer 181 may be removed. That is, the entire second insulating layer I2 on the etch stop layer 181 may be removed by using the etch stop layer 181. This may be achieved through a CMP process.

Figure 13:
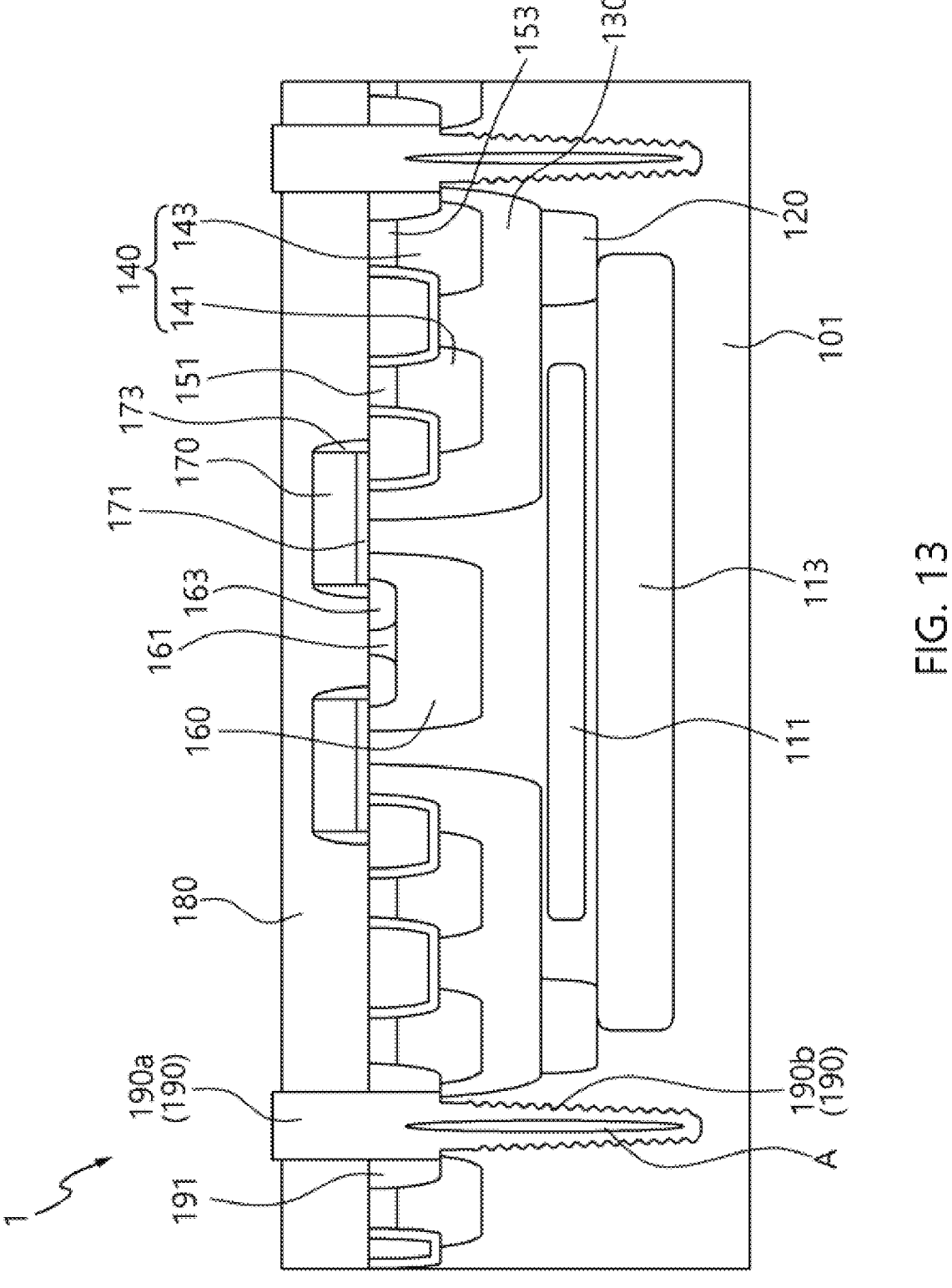

Then, referring to FIG. 13, the etch stop layer 181 may be subjected to an etching process and then a cleaning process.

The etch stop layer 181 may be removed by, for example, a dry etching process. As a result of the removal of the etch stop layer 181, a step may occur between a top surface of the interlayer insulating layer 180 and a top surface of the Pre-DTI region 190a. That is, the top surface of the Pre-DTI region 190a may be located higher than the top surface of the interlayer insulating layer 180.

Figure 14:
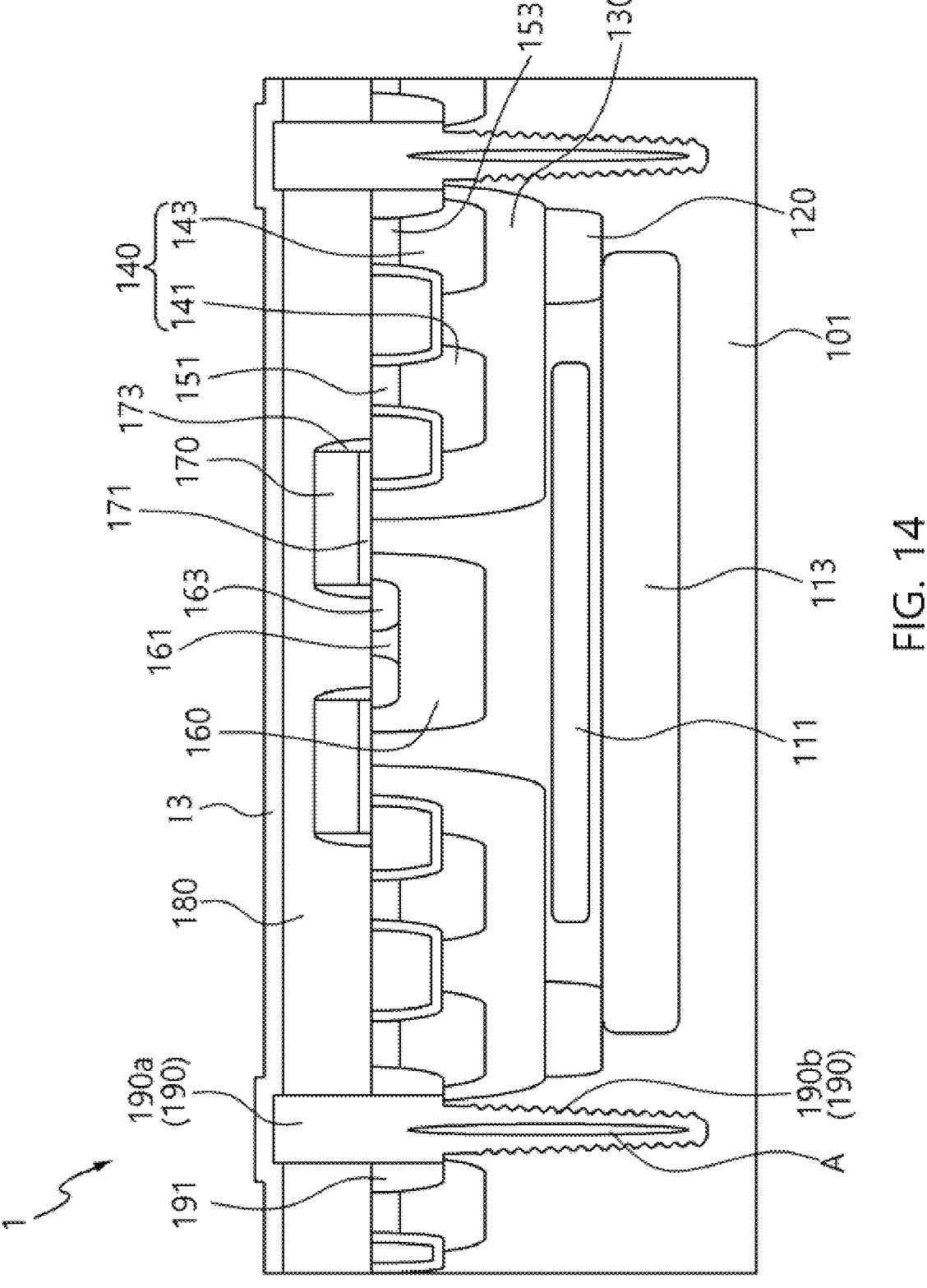

Then, referring to FIG. 14, a third insulating layer I3 may be deposited on the interlayer insulating layer 180 and the Pre-DTI region 190a. The third insulating layer I3 may include the same material as the interlayer insulating layer 180, and may be, for example, an arbitrary oxide layer.

Figure 15:
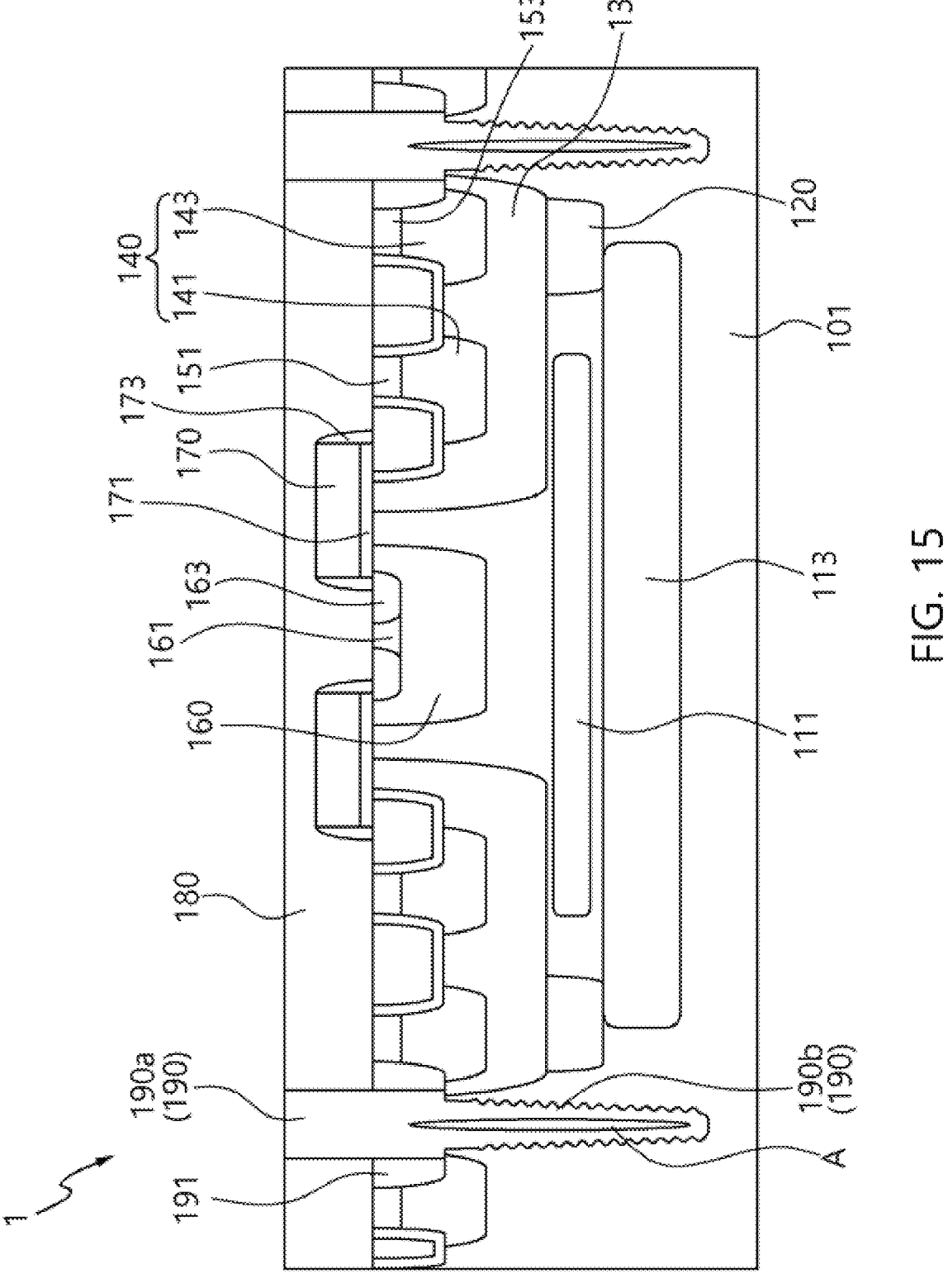

Then, referring to FIG. 15, the top surfaces of the interlayer insulating layer 180 and the Pre-DTI region 190a may be planarized through a CMP process. By this process, the step between the top surface of the interlayer insulating layer 180 and the top surface of the Pre-DTI region 190a may be removed.

The foregoing detailed description may be merely an example of the present disclosure. Also, the inventive concept is explained by describing the preferred embodiments and will be used through various combinations, modifications, and environments. That is, the inventive concept may be amended or modified without departing from the scope of the technical idea and/or knowledge in the art. The foregoing embodiments are for illustrating the best mode for implementing the technical idea of the present disclosure, and various modifications may be made therein according to specific application fields and uses of the present disclosure. Therefore, the foregoing detailed description of the present disclosure is not intended to limit the inventive concept to the disclosed embodiments.

What is claimed is:

1. A semiconductor device, comprising:
a substrate;
a gate electrode disposed on the substrate;
a source region defined in a surface of the substrate;
a drain region defined in the surface of the substrate and spaced apart from the source region;
a first device isolation region extending from the surface of the substrate to a predetermined depth and including an insulating material; and
an air gap in the first device isolation region, wherein the first device isolation region comprises:
a Pre-DTI region disposed in a top portion thereof; and
a DTI region having a top portion connected to a bottom portion of the Pre-DTI region and a bottom portion disposed at a predetermined depth in the substrate,
wherein an outer surface of the DTI region includes a substantially flat side and an embossed portion,
wherein the DTI region comprises:
a connection part connecting the Pre-DTI region and an extension part to each other while defining the top portion of the DTI region and having an outer surface that is substantially flat in a vertical direction; and
the extension part connected to a bottom portion of the connection part and extending downward to a predetermined depth while having an outer surface including a concave portion and a convex portion that are alternately arranged in the vertical direction, and
wherein the outer surface of the extension part has a laterally asymmetric side at a predetermined height.

2. The semiconductor device of claim 1, wherein the DTI region is configured such that a top outer surface thereof connected to the pre-DTI region is substantially flat to a predetermined depth.

3. The semiconductor device of claim 2, wherein the air gap has a bottom portion adjacent to the bottom portion of the DTI region and a top portion adjacent to the top portion of the DTI region.

4. The semiconductor device of claim 1, wherein the connection part is formed by a gap-filling process of filling an insulating material in a trench by a first etching process, and the extension part is formed by a gap-filling process of filling an insulating material in a trench by a second etching process.

5. The semiconductor device of claim 1, wherein the connection part has a central axis that is substantially vertical.

6. The semiconductor device of claim 1, further comprising an interlayer insulating layer disposed on the substrate and covering the gate electrode, wherein the Pre-DTI region has a structure passing through the interlayer insulating layer.

7. A semiconductor device comprising:
a substrate;
a gate electrode disposed on the substrate;
a source region defined in a surface of the substrate;
a drain region defined in the surface of the substrate and spaced apart from the source region;
a first device isolation region extending from the surface of the substrate to a predetermined depth;
an air gap in the first device isolation region; and
a second device isolation region extending from the surface of the substrate to a predetermined depth and positioned adjacent to at least one side of the first device isolation region, the second device isolation region being an STI region,
wherein the first device isolation region comprises:
a Pre-DTI region disposed in a top portion thereof; and
a DTI region having a top portion connected to a bottom portion of the Pre-DTI region and a bottom portion disposed at a predetermined depth in the substrate,
wherein the DTI region comprises:
a connection part connecting the Pre-DTI region and an extension part to each other while defining the top portion of the DTI region and having an outer surface substantially flat in a vertical direction; and
the extension part connected to a bottom portion of the connection part and extending downward to a predetermined depth while having an outer surface including a concave portion and a convex portion that are alternately arranged in the vertical direction, and
wherein the outer surface of the extension part has a laterally asymmetric side at a predetermined height.

8. The semiconductor device of claim 7, wherein the Pre-DTI region has a narrower width than the second device isolation region.

9. The semiconductor device of claim 7, further comprising:
a body region defined in the substrate and surrounding the source region;
a well region defined in the substrate and surrounding a first well region; and
the first well region defined in the well region and surrounding the drain region.

10. The semiconductor device of claim 9, further comprising:
a buried layer; and
a high voltage well region defined in the substrate and connected to the buried layer and the well region.

11. The semiconductor device of claim 7, wherein the connection part has a central axis that is substantially vertical, and the extension part has a side that extends obliquely.

12. The semiconductor device of claim 7, wherein the DTI region is formed by performing a plurality of different etching processes.

\* \* \* \* \*